(12) United States Patent
Hoshi et al.

(10) Patent No.: US 7,594,966 B2
(45) Date of Patent: Sep. 29, 2009

(54) METHOD FOR PRODUCING A SINGLE CRYSTAL

(75) Inventors: Ryoji Hoshi, Fukushima (JP); Susumu Sonokawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 387 days.

(21) Appl. No.: 10/573,822

(22) PCT Filed: Oct. 19, 2004

(86) PCT No.: PCT/JP2004/015395
§ 371 (c)(1),
(2), (4) Date: Mar. 28, 2006

(87) PCT Pub. No.: WO2005/042811
PCT Pub. Date: May 12, 2005

(65) Prior Publication Data
US 2006/0272570 A1  Dec. 7, 2006

(30) Foreign Application Priority Data
Oct. 30, 2003  (JP) ............... 2003-369855

(51) Int. Cl.
*C30B 15/00* (2006.01)
*C30B 28/10* (2006.01)
(52) U.S. Cl. ............... 117/89; 117/13; 117/14; 117/15; 117/20; 117/34; 117/932
(58) Field of Classification Search ............ 117/13, 117/34, 20, 89, 14, 15, 932
See application file for complete search history.

(56) References Cited

U.S. PATENT DOCUMENTS 5,980,630 A * 11/1999 Iino et al. ............... 117/32

(Continued)

FOREIGN PATENT DOCUMENTS

JP  A-07-223893  8/1995

(Continued)

OTHER PUBLICATIONS

D.T.J. Hurle et al.; "Mechanism of Swirl Defects Formation in Silicon"; *Journal of Crystal Growth*; vol. 59; 1982; pp. 625-643.

*Primary Examiner*—Robert M Kunemund
*Assistant Examiner*—G. Nagesh Rao
(74) *Attorney, Agent, or Firm*—Oliff & Berridge, PLC

(57) ABSTRACT

A method for producing a single crystal by pulling a single crystal from a raw material melt in a chamber according to the Czochralski method, including pulling a single crystal having a defect-free region, which is outside an OSF region, to occur in a ring shape in the radial direction, and in which interstitial-type and vacancy-type defects do not exist. The pulling of the single crystal is controlled so that an average cooling rate in passing through a temperature region of the melting point of the single crystal to 950° C. is in the range of 0.96° C./min or more, an average cooling rate in passing through a temperature region of 1150° C. to 1080° C. is in the range of 0.88° C./min or more, and an average cooling rate in passing through a temperature region of 1050° C. to 950° C. is in the range of 0.71° C./min or more.

5 Claims, 6 Drawing Sheets

U.S. PATENT DOCUMENTS

| | | | |
|---|---|---|---|
| 6,607,594 B2* | 8/2003 | Fujiwara et al. | 117/32 |
| 6,913,646 B2* | 7/2005 | Sakurada et al. | 117/13 |
| 7,214,268 B2* | 5/2007 | Sakurada et al. | 117/19 |
| 7,226,507 B2* | 6/2007 | Mitamura et al. | 117/13 |
| 7,364,618 B2* | 4/2008 | Hourai et al. | 117/20 |
| 7,442,251 B2* | 10/2008 | Inami et al. | 117/13 |
| 2002/0017234 A1* | 2/2002 | Ono et al. | 117/13 |
| 2002/0139298 A1* | 10/2002 | Okui et al. | 117/213 |
| 2002/0157600 A1* | 10/2002 | Fusegawa et al. | 117/30 |
| 2003/0116082 A1* | 6/2003 | Sakurada et al. | 117/20 |
| 2006/0065184 A1* | 3/2006 | Sakurada et al. | 117/19 |
| 2006/0156969 A1* | 7/2006 | Hourai et al. | 117/89 |
| 2006/0174819 A1* | 8/2006 | Mitamura et al. | 117/13 |
| 2006/0225640 A1* | 10/2006 | Ono et al. | 117/20 |
| 2007/0017436 A1* | 1/2007 | Ono et al. | 117/20 |
| 2007/0089666 A1* | 4/2007 | Koike | 117/20 |
| 2007/0095274 A1* | 5/2007 | Sugimura et al. | 117/2 |
| 2007/0095275 A1* | 5/2007 | Furukawa | 117/13 |
| 2007/0151505 A1* | 7/2007 | Cho | 117/13 |
| 2007/0157870 A1* | 7/2007 | Hourai et al. | 117/13 |
| 2008/0035050 A1* | 2/2008 | Sakurada | 117/13 |
| 2008/0302295 A1* | 12/2008 | Kotooka et al. | 117/14 |
| 2009/0090294 A1* | 4/2009 | Hong et al. | 117/13 |

FOREIGN PATENT DOCUMENTS

| | | |
|---|---|---|
| JP | A-08-157293 | 6/1996 |
| JP | A-08-330316 | 12/1996 |
| JP | A-11-043397 | 2/1999 |
| JP | A-11-079889 | 3/1999 |
| JP | A-2002-012498 | 1/2002 |
| JP | A-2002-226296 | 8/2002 |

* cited by examiner

METHOD FOR PRODUCING A SINGLE CRYSTAL

CROSS REFERENCE TO RELATED APPLICATIONS

This application, Ser. No. 10/573,822, is a national stage entry of PCT/JP04/15395 filed on Oct. 19, 2004, and a claim for foreign priority via application JP 2003-369855 filed Oct. 30, 2003 which are all hereby incorporated by reference for all purposes as if fully set forth herein.

TECHNICAL FIELD

The present invention relates to a method for producing a single crystal for slicing wafers or the like which are used as substrates for semiconductor devices such as memory or CPU, and particularly relates to a method for producing a single crystal having a defect-free region having been used in cutting-edge areas.

BACKGROUND ART

As a single crystal for slicing wafers or the like which are used as substrates for semiconductor devices such as memory or CPU, for example, a silicon single crystal can be exemplified and mainly has been produced in accordance with Czochralski Method (Hereinafter, abbreviated as CZ method).

When a single crystal is produced by CZ method, it is produced, for example, by using a single crystal-producing apparatus 1 as shown in FIG. 5.

The single crystal-producing apparatus 1 has members for containing and melting a raw material polycrystal such as silicon and heat insulating members for insulating heat, and they are contained in a main chamber 2. A pulling chamber 3 extending upwardly is continuously provided from a ceiling portion of the main chamber 2, and a mechanism for pulling a single crystal 4 (not shown) with a wire 5 is provided above it.

In the main chamber 2, a quartz crucible 7 for containing a melted raw material melt 6 and a graphite crucible 8 for supporting the quartz crucible 7 are provided, and these crucibles 7 and 8 are supported by a shaft 9 so that they can be rotated and moved upwardly or downwardly by a driving mechanism (not shown). To compensate a depression of a melt surface of the raw material melt 6 caused in connection with pulling of a single crystal 4, the driving mechanism for the crucibles 7 and 8 elevates them as much as the melt level depression.

And, a graphite heater 10 for melting the raw material is provided so as to surround the crucibles 7 and 8. A heat insulating member 11 is provided outside the graphite heater 10 so as to surround it in order to prevent that the heat from the graphite heater 10 is directly radiated on the main chamber 2.

Moreover, an inert gas such as argon gas is introduced into the main chamber 2 from a gas inlet duct 14 provided at an upper part of the pulling chamber 3. The introduced inert gas passes through a space between the single crystal 4 under pulling and a gas flow guide cylinder 12 and a space between a lower portion of the gas flow guide cylinder 12 and the melt surface of the raw-material melt 6, and then is discharged from a gas outlet duct 15.

In addition, a heat shielding member 13 is provided so as to face the raw material melt 6 at a lower edge outside the gas flow guide cylinder 12, and so that radiation from the surface of the raw material melt 6 is cut and so that the heat in the surface of the raw material melt 6 is kept.

A raw polycrystal is contained in a quartz crucible 7 provided in the single crystal-producing apparatus 1 as described above and heated by a graphite heater 10, and thereby the polycrystalline raw material within the quartz crucible 7 is melted. A seed crystal 17 fixed with a seed holder 16 connecting with the lower end of the wire 5 is immersed into the raw material melt 6 into which the polycrystalline raw material is melted as described above, and then the seed crystal 17 is pulled with rotation, and thereby the single crystal 4 having desired diameter and quality is grown under the seed crystal 17. At this time, after the seed crystal 17 is immersed into the material melt 6, a so-called necking that a neck portion is formed by once narrowing the diameter to about 3 mm is performed, and next it is enlarged to a desired diameter and a dislocation-free crystal is pulled.

Usually, in a silicon single crystal pulled as described above, there are intrinsic point defects of vacancy type (Vacancy) and interstitial type (Interstitial). Saturated concentration of the intrinsic point defects is determined by a function of temperature and they become in a supersaturation state with temperature lowering under the crystal growth. In the supersaturation state, annihilation, out-diffusion, up-hill diffusion, and so forth, occur, followed by proceeding in the direction of relaxing the supersaturation state. As a result, any one type of vacancy type and interstitial type remains as dominant supersaturated point defects.

And, it is known that if the crystal growth rate is high, the crystal is easy to be in a state that vacancy-type defects is excess, and conversely, if the crystal growth rate is low, the crystal is easy to be in a state that interstitial-type defects is excess. If the excess concentration becomes a criticality or more, they are aggregated to form secondary defects under the crystal growth.

And, it is known in the case that the growth rate (V) is changed from a high rate to a low rate in the crystal axis direction, a defect distribution map as shown in FIG. 6 can be obtained.

In the case that the growth rate is relatively high rate, vacancy-type defects become dominant in the single crystal. In this case, as secondary defects, Void defects observed as COP (Crystal Originated Particle), FPD (Flow Pattern Defect), or the like are formed. And, a region in which these defects are distributed is called as V region. Moreover, it is known that in the vicinity of the boundary of the V region, defects observed as OSF (Oxidation Induced Stacking Fault) after oxidation treatment are distributed. And, a region in which these defects are distributed is called as OSF region. These secondary defects lead to degradation of oxide film properties.

On the other hand, in the case that the growth rate is relatively low, interstitial-type defects become dominant in the single crystal. In this case, secondary defects observed as LSEPD (Large Secco Etch Pit Defect), LFPD (Large Flow Pattern Defect), and so forth, which are originated from dislocation loops are formed. And, a region in which these defects exist is called as I region. These secondary defects lead to serious fault such as leakage.

In recent years, it is confirmed that between V region and I region and outside OSF region, there exists a region in which there are neither FPD, COP, and so forth originated from vacancies, nor LSEPD, LFPD, and so forth originated from dislocation loops into which interstitial silicones aggregate. The region is called as N region (defect-free region). Moreover, the N region is further categorized that Nv region adjacent outside OSF region (a region in which a large number of vacancies exist) and Ni region adjacent to I region (a region in which a large number of interstitial silicones exist). It is found that in Nv region, when heat treatment is performed, amount of precipitated oxygen is large and in Ni region, oxygen precipitation is little.

With regard to these defects, it is thought that the introduced amount is determined by a parameter of V/G value, which is a ratio of the growth rate (V) and a temperature gradient (G) near the growth interface (See, for example, V. V. Voronkov, Journal of Crystal Growth, 59 (1982) 625-643). That is, if the growth rate (V) and the temperature gradient (G) are adjusted so that the V/G value becomes in a predetermined range, a single crystal can be pulled in a desired defect region.

And, the crystal pulled so that the growth rate (V) and the temperature gradient (G) near the growth interface are adjusted so as to be N region is called as a defect-free crystal. For pulling a defect-free crystal in which a concentration of excess point defects in the single crystal is lowered without limit, it has been required that the growth rate (V) and the temperature gradient (G) are controlled so that a V/G value as indicated by the growth rate (V) and the temperature gradient (G) near the growth interface becomes in a very limited range (See, for example, Japanese Patent Application Laid-open (kokai) No. 8-330316 and No. 11-79889). However, it is very difficult to pull a single crystal by adjusting the growth rate (V) and so forth so as to be in a very narrow range. Therefore, there has been a problem that in the case of pulling a defect-free crystal, defectives practically occur frequently and yield and productivity are largely lowered.

DISCLOSURE OF THE INVENTION

The present invention was conceived in view of the above problems. An object of the present invention is to provide a method for producing a single crystal, by which a range of V/G value to be N region can be considerably and more certainly enlarged, namely production margin in pulling a single crystal having a defect-free region can be considerably enlarged, and by which production yield and productivity of the crystal having a defect-free region can be considerably improved.

In order to accomplish the above object, according to the present invention, there is provided a method for producing a single crystal by pulling a single crystal from a raw material melt in a chamber in accordance with Czochralski method, comprising pulling a single crystal having a defect-free region which is outside an OSF region to occur in a ring shape in the radial direction and which interstitial-type and vacancy-type defects do not exist in, wherein the pulling of the single crystal is performed with being controlled so that an average of cooling rate in passing through a temperature region of the melt point of the single crystal to 950° C. is in the range of 0.96° C./min or more and so that an average of cooling rate in passing through a temperature region of 1150° C. to 1080° C. is in the range of 0.88° C./min or more and so that an average of cooling rate in passing through a temperature region of 1050° C. to 950° C. is in the range of 0.71° C./min or more.

In pulling a single crystal, by rapid cooling so that the cooling rates are controlled to be within the above-described ranges in passing through a temperature region of the melt point of the single crystal to 950° C., a temperature region of 1150° C. to 1080° C., and a temperature region of 1050° C. to 950° C., a range of V/G value to be N region existing between V region and I region and outside OSF region can be considerably and more certainly enlarged. Because production margin in the case of producing a single crystal having a defect-free region can be considerably enlarged as described above, there can be obtained an effect that production of a defect-free crystal becomes relatively easy and yield and productivity of the single crystal having a defect-free region can be considerably improved.

In this case, a growth rate margin for pulling the single crystal having a defect-free region (an upper limit of the growth rate–a lower limit of the growth rate) can be in the range of 7% or more of a growth rate average of the single crystal ((the upper limit of the growth rate+the lower limit of the growth rate)÷2).

In a method for producing a single crystal according to the present invention, a cooling rate in passing through a temperature region in which point defects are aggregated is fast as described above, and therefore point defects become difficult to be aggregated. As a result, a growth rate margin for pulling the single crystal having a defect-free region can be in the very large range of 7% or more. If the growth rate margin is large as described above, controlling of the growth rate in pulling a single crystal having a defect-free region is relatively easy. Therefore, a single crystal having a defect-free region becomes possible to be pulled more surely and yield and productivity of the crystal having a defect-free region can be considerably improved.

In this case, the controlling of the temperature region for pulling the single crystal can be performed by arranging at least a cooling cylinder to be forced cooled with a cooling medium and an auxiliary member for cooling in the chamber.

The controlling of cooling rate in passing through a temperature region in which point defects are aggregated can be performed, for example, by arranging a cooling cylinder to be forced cooled with a cooling-medium and an auxiliary member for cooling in the single crystal-producing apparatus. In addition, as an auxiliary member for cooling, for example, there can be exemplified a member to be arranged so as to extend downwardly from the cooling cylinder, which has a cylindrical shape or a shape having diameter narrowed downwardly.

In this case, the single crystal to be produced can be a silicon single crystal.

The method for producing a single crystal according to the present invention is effective for producing a silicon single crystal for which improvement of production yield and productivity of a single crystal having a defect-free region is required strongly in the recent years.

In this case, a diameter of the straight body of the single crystal can be 150 mm or more.

The method for producing a single crystal according to the present invention is particularly effective for producing a single crystal having a large diameter, a diameter of the straight body of 150 mm or more, which is easy to generate secondary defects and therefore strongly requires a method for producing a defect-free crystal more certainly.

In this case, it is preferable that the pulling of the single crystal is performed with applying a magnetic field of a central magnetic field strength in the range of 300 gauss to 6000 gauss.

By applying the magnetic field in pulling a single crystal as described above, there can be accomplished a good crystal growth interface shape for growing a single crystal having a defect-free region. Therefore, in producing a defect-free crystal, higher production yield and higher productivity can be accomplished.

And, according to the present invention, a single crystal produced by the method for producing a single crystal as described above is provided.

Single crystals produced by the method for producing a single crystal according to the present invention include few defectives and are defect-free crystals of very high quality. Furthermore, a single crystal according to the present invention is produced with high yield and high productivity and therefore is relatively cheaper as compared to a conventional crystal.

As described above, according to the present invention, since cooling rate in passing through a temperature region in which point defects are aggregated is made to be fast, a range of V/G value to be N region can be considerably and more certainly enlarged, namely, production margin of a defect-free crystal can be considerably enlarged. Therefore production yield and productivity of the single crystal having a defect-free region can be considerably improved.

BEST MODE FOR CARRYING OUT THE INVENTION

Hereinafter, the present invention will be explained in more detail. However, the present invention is not limited to this.

The present inventors have repeatedly studied methods for enlarging the range of a V/G value to be N region, namely, production margin of a defect-free crystal.

Figure 1:
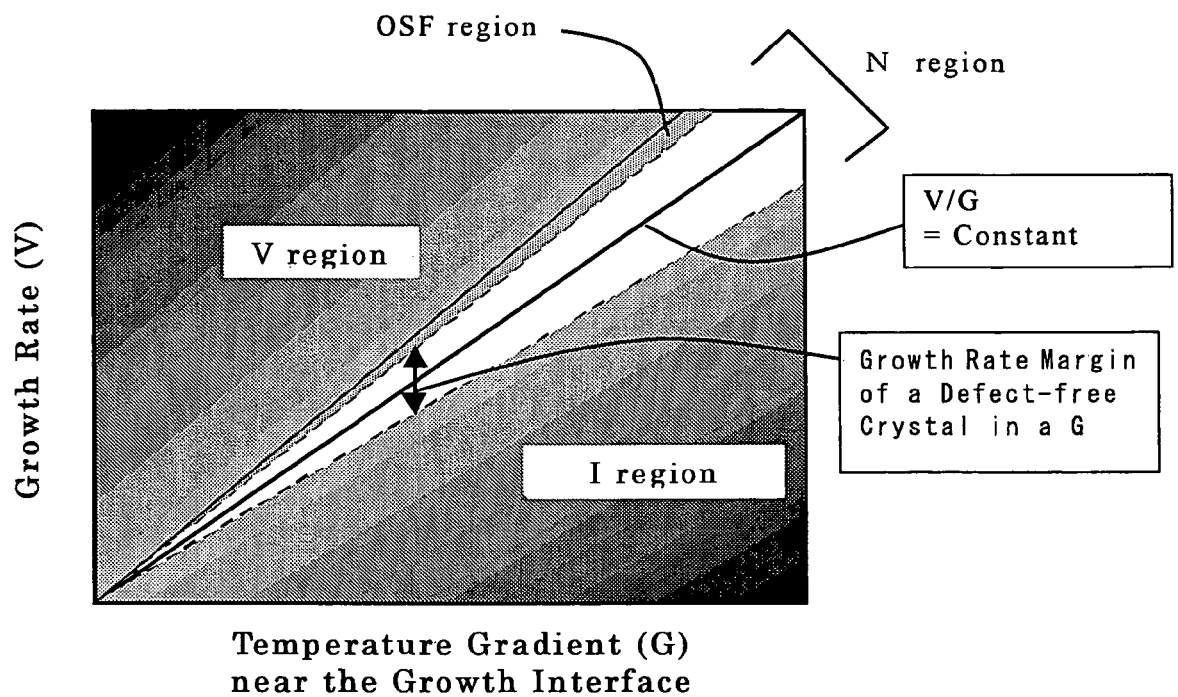
FIG. 1 is a graph showing production margin of the defect-free crystal.

Production margin of a defect-free crystal will be explained with reference to FIG. 1. In FIG. 1, under a state of V/G=Constant, dominant point defects are neither vacancy-type nor interstitial-type and it is under a state that both of them are antagonized. In this state, there is no generation of secondary defects as a matter of course and a defect-free state can be accomplished. In addition of this, if excess point defects have a certain concentration or less, they are not aggregated to be as large as detected as secondary defects, and practically, this part also becomes a defect-free region (N region). The range of a V/G value including this part becomes so-called production margin of the defect-free region.

On the other hand, a concentration of excess point defects so as not to become as large as detected as secondary defects is largely influenced by a thermal situation of the temperature region in which point defects are aggregated. Briefly, if the passage time for this temperature region is extremely short, it is thought that however many point defects exist, they are not aggregated to be as large as detected as secondary defects. Therefore, as the passage time for this temperature region is shorter, production margin is larger.

Here, in Japanese Patent Application Laid-open (kokai) No. 2002-226296, there has been described a method for controlling an average of cooling rate in passing through a temperature region of 1080° C. to 1150° C. to be 1° C./min or more and enlarging a growth rate margin of the defect-free crystal. However, there has been still a scope for improvement with regard to certainty for enlarging a growth rate margin of the defect-free crystal.

From these points, the present inventors have repeatedly studied more circumstantially about the temperature region in which excess intrinsic point defects are aggregated in pulling a single crystal. And, as a result of the studies, it has been found that if particularly in pulling a single crystal, the pulled single crystal is rapidly cooled in passing through a temperature region of the melt point of the single crystal to 950° C., a temperature region of 1150° C. to 1080° C., a temperature region of 1050° C. to 950° C., aggregation of point defects can be prevented and production margin of a defect-free region in which secondary defects that are aggregates of the point defects are not detected can be considerably and more certainly enlarged. And, the present invention has been accomplished.

Hereinafter, a single crystal-producing apparatus by which in pulling a single crystal, the respective temperature regions can be controlled so as to cool rapidly is explained with reference to FIG. 2. However, the present invention is not limited to this apparatus.

Figure 2:
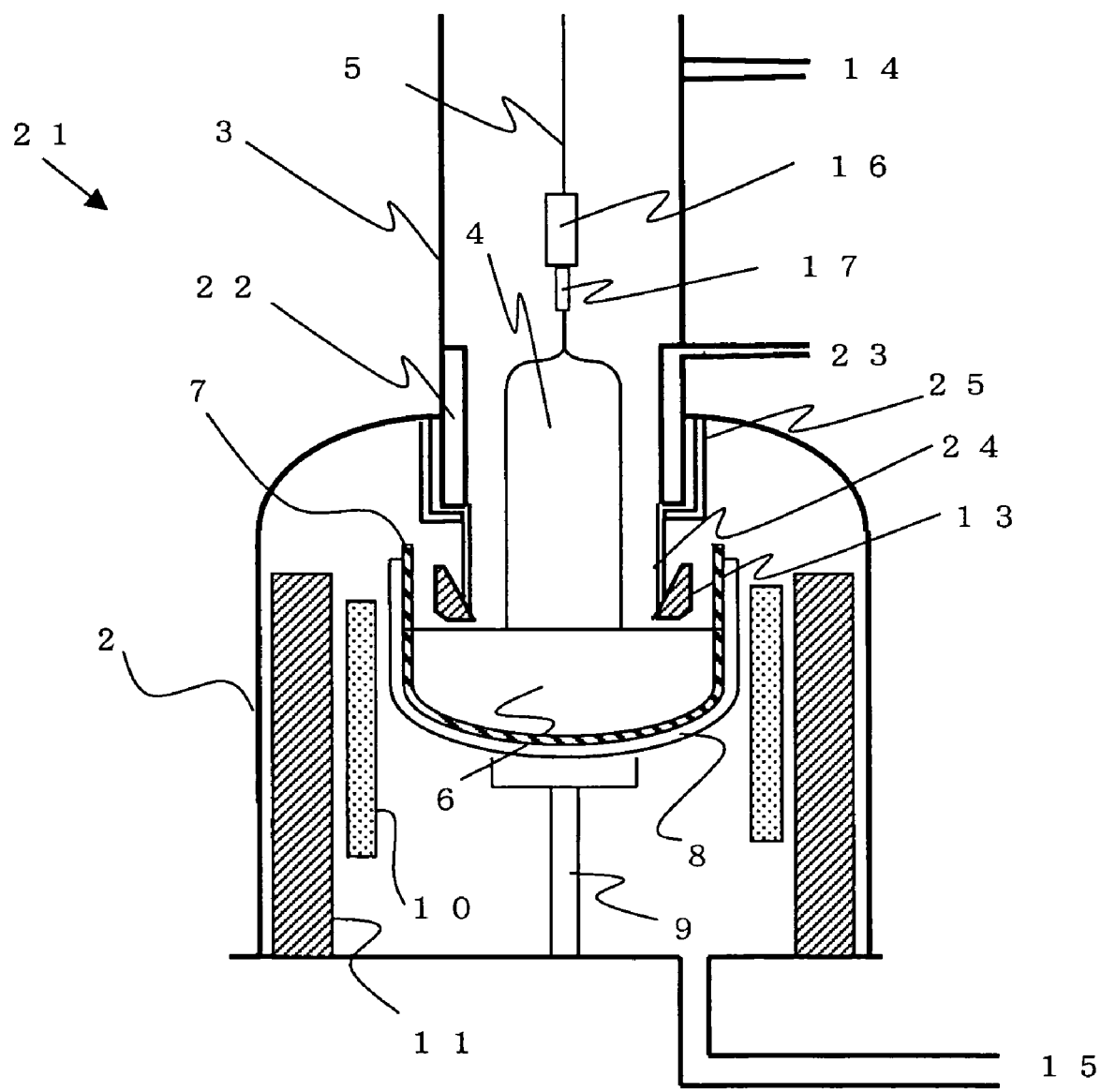
FIG. 2 is a schematic section view showing an example of a single crystal-producing apparatus used in the present invention.
Figure 5:
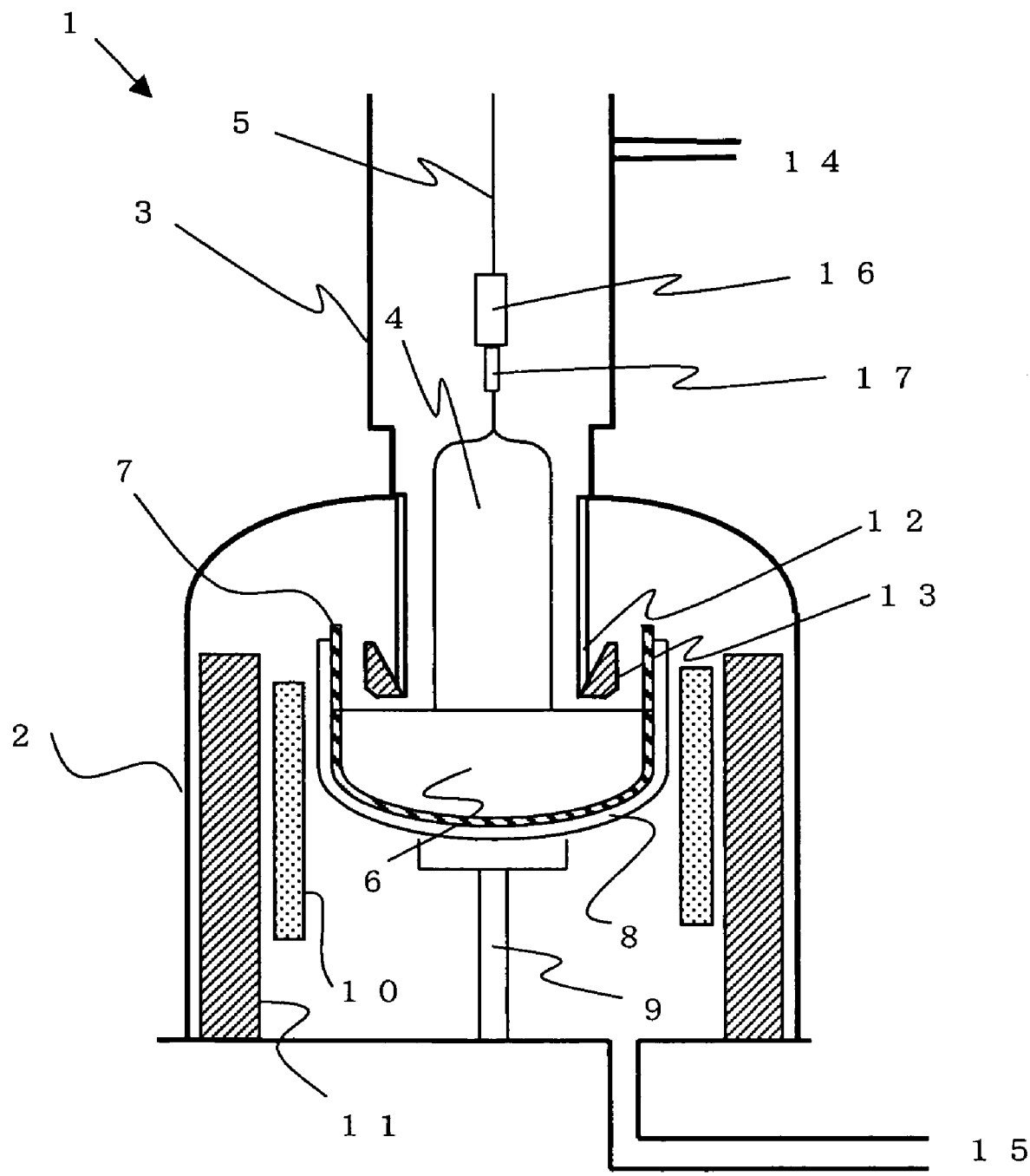
FIG. 5 is a schematic section view showing an example of a single crystal-producing apparatus having been conventionally used.
Figure 6:
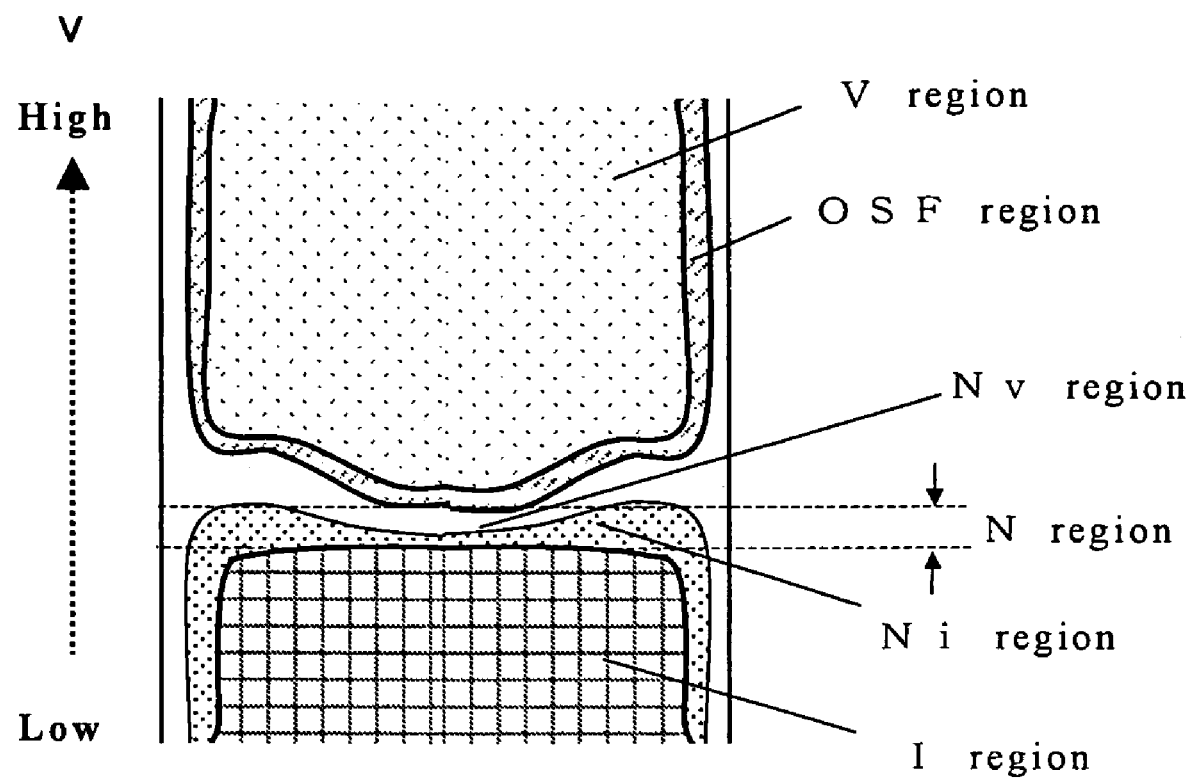
FIG. 6 is a schematic section view showing a distribution of crystal defect regions.

The single crystal-producing apparatus 21 as shown in FIG. 2 has a cooling cylinder 22, a cooling-medium inlet duct 23, an auxiliary member 24 for cooling, a protective member 25. However the other members are the same as the above-mentioned single crystal-producing apparatus 1 as shown in FIG. 5.

The single crystal apparatus 21 has a cooling cylinder 22, and the cooling cylinder 22 extends toward the surface of a raw material melt 6 from a ceiling portion of the main chamber 2 so as to surround a single crystal 4 under pulling. In the cooling cylinder 22, a cooling medium is introduced from the cooling medium inlet duct 23, and the cooling medium circulates in the cooling cylinder 22 and forces to cool the cooling cylinder 22 and then is discharged outside.

In addition, if flow amount or temperature of the cooling medium to be flowed in the cooling cylinder 22 is adjusted according to need, removal amount of heat of the cooling cylinder 22 can changed. Thereby, a desired cooling atmosphere can be produced, and therefore, in pulling a single crystal, it becomes possible to control the pulling so that the respective temperature regions can be rapidly cooled at desired cooling rate.

Moreover, a cylindrical auxiliary member 24 for cooling which extends in the vicinity of the surface of the raw material melt from the lower edge of the cooling cylinder 22 is provided. The auxiliary member 24 for cooling surrounds a single crystal 4 of high temperature immediately after pulled and have an effect for cooling the single crystal 4 by shielding radiant heat from the graphite heater 10, the raw material melt 6, or the like. In addition, a shape of the auxiliary member for cooling is not limited to a cylindrical shape and, for example, a shape in which the diameter is narrowed downwardly can be also exemplified.

Also, by changing arrangement position, shape, and so forth of this cooling auxiliary member, it is possible to control the pulling of the single crystal so that the respective temperature regions can be rapidly cooled at desired cooling rate.

Furthermore, outside the cooling cylinder 22, the protective member 25 is provided. The protective member 25 extends from a ceiling portion of the main chamber 2 and is arranged so as to cover the peripheral surface including the lower edge of the cooling cylinder 22. By providing the protective member 25, a raw material melt which is in a danger of spattering in melting of a raw material polycrystal or the like can be prevented from adhering to the cooling cylinder 22, and radiant heat from a graphite heater 10 and such can be prevented from being directly radiated to the cooling cylinder 22. Therefore, heat removal effect of the cooling cylinder 22 is also improved.

And, by using such a single crystal-producing apparatus as above, the present invention provides a single crystal-producing method for producing a single crystal as follows.

That is, a method for producing a single crystal according to the present invention is a method for producing a single crystal by pulling a single crystal from a raw material melt in a chamber in accordance with Czochralski method, comprising pulling a single crystal having a defect-free region which is outside an OSF region to occur in a ring shape in the radial direction and which interstitial-type and vacancy-type defects do not exist in, wherein the pulling of the single crystal is performed with being controlled so that an average of cooling rate in passing through a temperature region of the melt point of the single crystal to 950° C. is in the range of 0.96° C./min or more and so that an average of cooling rate in passing through a temperature region of 1150° C. to 1080° C. is in the range of 0.88° C./min or more and so that an average of cooling rate in passing through a temperature region of 1050° C. to 950° C. is in the range of 0.71° C./min or more.

In addition, it is preferable that an average of cooling rate in passing through the respective temperature regions is in the range of 10° C./min or less. In this range, even in the case of producing a crystal having a large diameter in which a diameter of the straight body is 150 mm or more, a defect-free crystal of high quality in which N region has enlarged in the whole plane can be produced stably.

Here, as an aggregation temperature region of point defects, it is said that a temperature region in which vacancy-type defects form into void defects that are secondary defects is at about 1150° C. to 1080° C. and that a temperature region in which OSF is formed is in the vicinity of 1000° C. On the other hand, a temperature region in which interstitial-type defects are aggregated are not clearly found, and however it is thought to be a relatively high temperature in view of generation of dislocation clusters and so forth. The present inventors have repeatedly studied with considering these, and as a result, in a method for producing a single crystal according to the present invention, a pulled single crystal are forced to cool rapidly as described above in passing through temperature regions of a temperature in the vicinity of the melt point of the single crystal to a temperature about below 1000° C., specially, in passing respectively through a temperature region of the melt point of the single crystal to 950° C., a temperature region of 1150° C. to 1080° C., and a temperature region of 1050° C. to 950° C.

By controlling the cooling rate as described above, a range of V/G value to be N region existing between V region and I region and outside OSF region can be considerably and more certainly enlarged. Because production margin of a single crystal having a defect-free region can be considerably enlarged as described above, there can be obtained an effect that production of a defect-free crystal becomes relatively easy and yield and productivity of the single crystal having a defect-free region can be considerably improved.

Enlargement of the production margin of a defect-free crystal can be expected also in the case that a temperature gradient (G) near the growth interface and the growth rate (V) are large as estimated from the graph as shown in FIG. 1. Therefore, a growth rate margin in which production margin of the defect-free crystal is viewed from the viewpoint of the growth rate (V) becomes easy to compare when the comparison is carried out by viewing the value standardized by the growth rate. According to the above-described method for producing a single crystal of the present invention, a growth rate margin for pulling the single crystal having a defect-free region (an upper limit of the growth rate–a lower limit of the growth rate) can be in a very large range, a range of 7% or more of a growth rate average of the single crystal ((the upper limit of the growth rate+the lower limit of the growth rate)÷2). If the growth rate margin is large as described above, controlling of the growth rate in pulling a single crystal having a defect-free region is relatively easy. Therefore, a single crystal having a defect-free region becomes possible to be pulled more certainly and yield and productivity of the crystal having a defect-free region becomes considerably improved.

The method for producing a single crystal according to the present invention is effective for producing a silicon single crystal for which improvement of production yield and productivity of a single crystal having a defect-free region is required strongly in the recent years. Moreover, the method is particularly effective for producing a single crystal having a large diameter including a range of diameter of the straight body of 150 mm or more, which is easy to generate secondary defects and therefore strongly requires a method for producing a defect-free crystal more certainly.

Furthermore, in the method for producing a single crystal of the present invention, it is preferable that the defect-free crystal is grown with applying a magnetic field of a central magnetic field strength in the range of 300 gauss to 6000 gauss. By applying a magnetic field in pulling a single crystal as described above, there can be accomplished a good crystal growth interface shape for growing a single crystal having a defect-free region. Therefore, in producing a defect-free crystal, higher production yield and higher productivity can be accomplished.

And, single crystals produced by the method for producing a single crystal according to the present invention include few defectives and are defect-free crystals of very high quality. Moreover, in a producing method of the present invention, such a single crystal can be produced with high yield and high productivity and therefore a defect-free crystal of high quality can be provided relatively cheaper as compared to a conventional crystal.

Hereinafter, the present invention will be specially explained by exemplifying Examples and Comparative Examples.

EXAMPLE 1

In the single crystal-producing apparatus 21 in FIG. 2 having a cooling cylinder 22, a quartz crucible 7 having a diameter of 24 inches (about 600 mm) was provided, and then, 150 kg of a raw material polycrystalline silicon was charged in the quartz crucible 7 and melted to be a raw material melt 6. And, in accordance with Czochralski method (CZ method), a silicon single crystal 4 having a diameter of the straight body of 8 inches (about 200 mm) and a length of the straight body of about 130 cm was grown with lowering the growth rate gradually.

In addition, in growing the silicon single crystal 4, a horizontal magnetic field of a central magnetic field strength of 4000 G was applied. Moreover, the interval between the surface of the raw material melt 6 and heat shielding member 13 was 60 mm so that the temperature gradient (G) near the growth interface was maintained to be constant in a measure.

Figure 3:
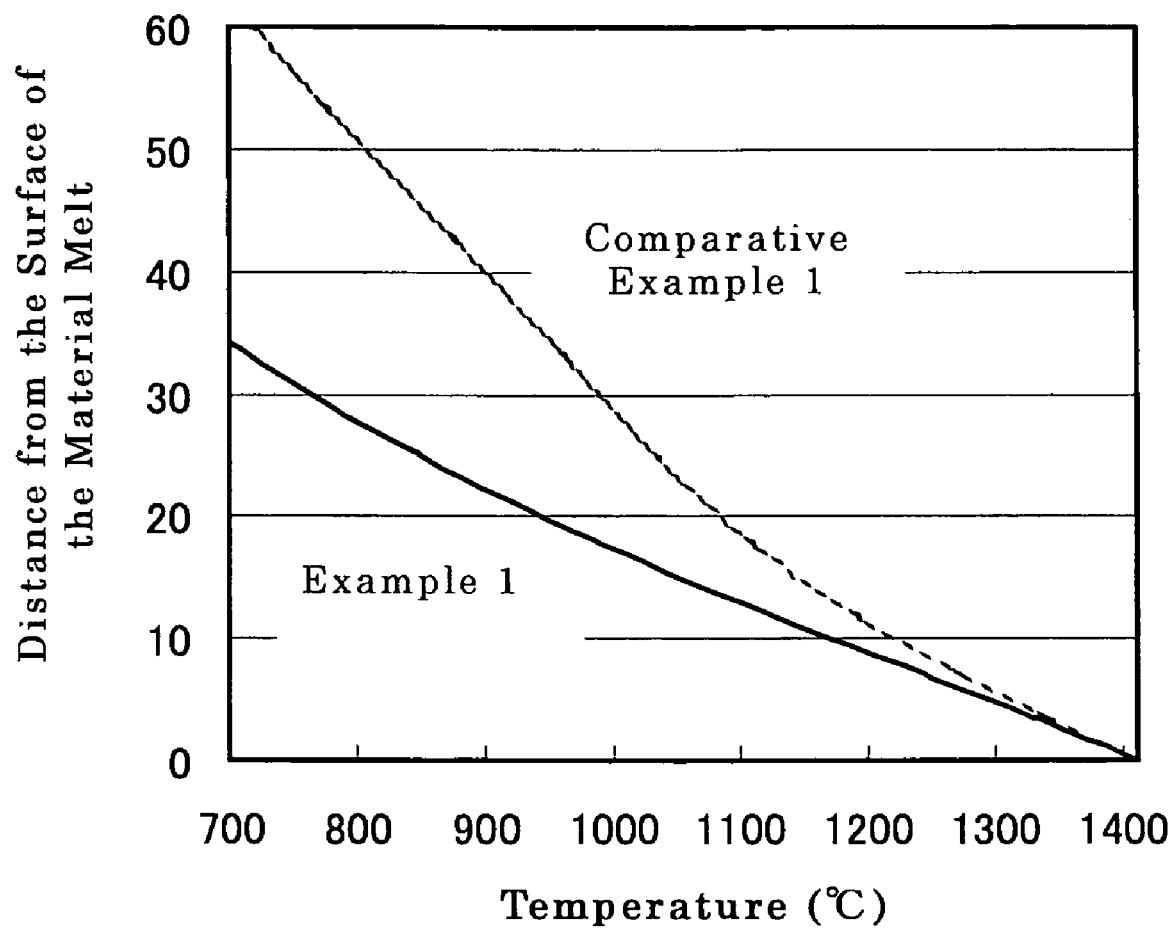
FIG. 3 is a graph showing temperature distributions of the pulled single crystal in Example 1 and in Comparative Example 1.

Furthermore, by adjusting flow amount and temperature of the cooling medium to be flowed in the cooling cylinder 22, an average of cooling rate in passing through a temperature region of the melt point to 950° C. was controlled to be about 1.31° C./min, an average of cooling rate in passing through a temperature region of 1150° C. to 1080° C. was controlled to be about 1.35° C./min, and an average of cooling rate in passing through a temperature region of 1050° C. to 950° C. was controlled to be about 1.21° C./min. Furthermore, the temperature distribution of the pulled single crystal in this time is shown in FIG. 3. Also, from the FIG. 3, it was found that in the single crystal-producing apparatus used in Example 1, cooling rate was very fast.

Next, the single crystal grown in such a manner as described above was cut longitudinally to produce samples and such investigation of crystal defect distribution as presented as follows was performed.

(1) Inspection of FPD (V Region) and LSEPD (I Region)

After subjecting the samples for inspection to secco etching for 30 minutes without stirring, the presence or absence of crystal defects was confirmed by microscopic observation.

(2) Inspection of OSF

After subjecting the samples for inspection to heat treatment at 1150° C. for 100 minutes under an atmosphere of wet oxygen, the presence or absence of OSF was confirmed by microscopic observation.

From a result of the investigation, a growth rate margin of a defect-free region was obtained. As a result, the growth rate margin (an upper limit of the growth rate−a lower limit of the growth rate) was 10.7% of a growth rate average of the single crystal ((the upper limit of the growth rate+the lower limit of the growth rate)÷2), and it was found that production margin of the single crystal having a defect-free region was possible to be enlarged considerably.

Next, by using the single crystal-producing apparatus in FIG. 2, a single crystal having a defect-free region was grown in a range of the growth rate margin obtained as described above. As a result, a defect-free crystal in which secondary defects were not generated over the whole length of the straight body was possible to be grown.

EXAMPLE 2

In the single crystal-producing apparatus 21 in FIG. 2 having a cooling cylinder 22, a quartz crucible 7 having a diameter of 18 inches (about 450 mm) was provided, and then, 70 kg of raw material polycrystalline silicon was charged in the quartz crucible 7 and melted to be a raw material melt 6. And, in accordance with Czochralski method (CZ method), a silicon single crystal 4 having a diameter of the straight body of 6 inches (about 150 mm) and a length of the straight body of about 100 cm was grown with lowering the growth rate gradually.

In addition, in growing the silicon single crystal 4, a horizontal magnetic field of a central magnetic field strength of 3000 G was applied. Moreover, the interval between the surface of the raw material melt 6 and heat shielding member 13 was 50 mm so that the temperature gradient (G) near the growth interface was maintained to be constant in a measure.

Furthermore, by adjusting flow amount and temperature of the cooling medium to be flowed in the cooling cylinder 22, an average of cooling rate in passing through a temperature region of the melt point to 950° C. was controlled to be about 1.64° C./min, an average of cooling rate in passing through a temperature region of 1150° C. to 1080° C. was controlled to be about 1.56° C./min, and an average of cooling rate in passing through a temperature region of 1050° C. to 950° C. was controlled to be about 1.56° C./min.

Next, a single crystal grown in such a manner as described above was cut longitudinally to produce samples and investigation of crystal defect distribution was performed by the same method as Example 1.

As a result, the growth rate margin for pulling the single crystal having a defect-free region (an upper limit of the growth rate−a lower limit of the growth rate) was 13.2% of a growth rate average of the single crystal ((the upper limit of the growth rate+the lower limit of the growth rate)÷2), and it was found that production margin of the single crystal having a defect-free region was possible to be enlarged considerably.

Next, by using the single crystal-producing apparatus in FIG. 2, a single crystal having a defect-free region was grown in a range of the growth rate margin obtained as described above. As a result, a defect-free crystal in which secondary defects were not generated over the whole length of the straight body was possible to be grown.

COMPARATIVE EXAMPLE 1

By using the single crystal-producing apparatus 1 having no cooling cylinder in FIG. 5, a silicon single crystal was grown with changing the growth rate by the same manner as Example 1.

However, because this single crystal-producing apparatus 1 has no cooling cylinder, cooling rate cannot be controlled. Therefore, an average of cooling rate in passing through a temperature region of the melt point to 950° C. became about 0.64° C./min, an average of cooling rate in passing through a temperature region of 1150° C. to 1080° C. became about 0.58° C./min, and an average of cooling rate in passing through a temperature region of 1050° C. to 950° C. became about 0.43° C./min. Furthermore, the temperature distribution of the pulled single crystal at this time is shown in FIG. 3. Also from the FIG. 3, it was found that in the single crystal-producing apparatus used in Comparative Example 1, cooling rate was very slow as compared to the single crystal-producing apparatus used in Example 1.

Next, a single crystal grown in such a manner as described above was cut longitudinally to produce samples and investigation of crystal defect distribution was performed by the same method as Example 1.

As a result, the growth rate margin for pulling the single crystal having a defect-free region (an upper limit of the growth rate−a lower limit of the growth rate) was 4.2% of a growth rate average of the single crystal ((the upper limit of the growth rate+the lower limit of the growth rate)÷2), and production margin of the single crystal having a defect-free region was very small.

Next, by using the single crystal-producing apparatus in FIG. 5, a single crystal having a defect-free region was grown in a range of the growth rate margin obtained as described above. However, because the growth rate margin was very narrow, it was difficult to control the growth rate and secondary defects were generated in part and there could not be grown a defect-free crystal in which no secondary defect was generated over the whole length of the straight body.

COMPARATIVE EXAMPLE 2

By using the single crystal-producing apparatus 1 in FIG. 5, a silicon single crystal was grown with changing the growth rate by the same manner as Example 2.

However, because this single crystal-producing apparatus 1 has no cooling cylinder, cooling rate cannot be adjusted. Therefore, an average of cooling rate in passing through a temperature region of the melt-point to 950° C. was about 0.84° C./min, an average of cooling rate in passing through a temperature region of 1150° C. to 1080° C. was about 0.72° C./min, and an average of cooling rate in passing through a temperature region of 1050° C. to 950° C. was about 0.59° C./min.

Next, a single crystal grown in such a manner as described above was cut longitudinally to produce samples and investigation of crystal defect distribution was performed by the same method as Example 1.

As a result, the growth rate margin for pulling the single crystal having a defect-free region (an upper limit of the growth rate−a lower limit of the growth rate) was 6.1% of a growth rate average of the single crystal ((the upper limit of the growth rate+the lower limit of the growth rate)÷2), and production margin of the single crystal having a defect-free region was very small.

Next, by using the single crystal-producing apparatus in FIG. 5, a single crystal having a defect-free region was grown in a range of the growth rate margin obtained as described above. However, because the growth rate margin was very narrow, it was difficult to control the growth rate and secondary defects were generated in part and there could not be grown a defect-free crystal in which no secondary defect was generated over the whole length of the straight body.

Figure 4:
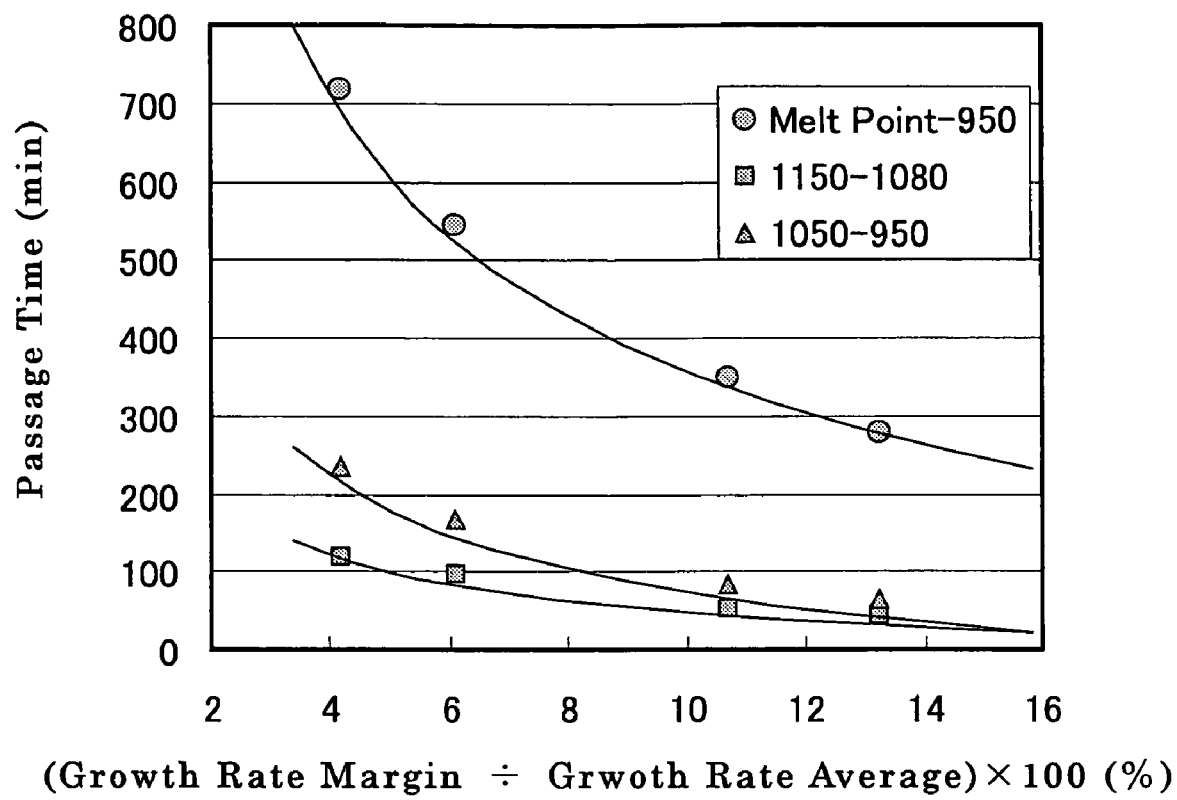
FIG. 4 is a graph showing the relation of (growth rate margin÷growth rate average)×100% and passage time (min) in the respective temperature regions.

Next, from the results of Examples 1 and 2 and Comparative Examples 1 and 2, a graph showing a relation of the passage times and (the growth rate margin÷the growth rate average)×100% in the respective temperature regions was drawn as FIG. 4. As found from FIG. 4, for example, in order that a growth rate margin for pulling the single crystal having a defect-free region (an upper limit of the growth rate−a lower limit of the growth rate) is in the range of 7% or more of a growth rate average of the single crystal ((the upper limit of the growth rate+the lower limit of the growth rate)÷2), a passage time in passing through a temperature region of the melt point to 950° C. may be controlled about 480 min or less (the average of cooling rate is 0.96° C./min or more), a passage time in passing through a temperature region of 1150° C. to 1080° C. may be controlled 80 min or less (the average of cooling rate is 0.88° C./min or more), and an a passage time in passing through a temperature region of 1050° C. to 950° C. may be controlled 140 min or less (the average of cooling rate is 0.71° C./min or more).

Usually, the growth rate margin is about 4% of the growth rate average or at most 6% or less. If this can be more than 6%, for example, increased to 7% or more, a defect-free crystal whose whole plane is N region become possible to be grown stably. In particular, if this can be 10% or more, the crystal rarely comes to shift from N region and secondary defects rarely come to occur in part of the crystal.

In addition, the present invention is not limited to the embodiments described above. The above-described embodiments are examples, and those having the substantially same constitution as technical idea described in the appended claims and providing the similar working effects are included in the scope of the present invention.

The invention claimed is:

1. A method for producing a single crystal by pulling a single crystal from a raw material melt in a chamber in accordance with Czochralski method,
comprising pulling a single crystal having a defect-free region which is outside an OSF region to occur in a ring shape in the radial direction and in which interstitial-type and vacancy-type defects do not exist by controlling a V/G value as indicated by a growth rate (V) and a temperature gradient (G) near a growth interface,
wherein the pulling of the single crystal is performed with being controlled by arranging at least a cooling cylinder to be forced cooled with a cooling medium and an auxiliary member for cooling in the chamber so that an average of cooling rate in passing through a temperature region of the melt point of the single crystal to 950° C. is in the range of 0.96° C./min or more and so that an average of cooling rate in passing through a temperature region of 1150° C. to 1080° C. is in the range of 0.88° C./min or more and so that an average of cooling rate in passing through a temperature region of 1050° C. to 950° C. is in the range of 0.71° C./min or more, and thereby preventing aggregation of point defects, and
wherein a growth rate margin for pulling the single crystal having a defect-free region (an upper limit of the growth rate−a lower limit of the growth rate) is in the range of 7% or more of a growth rate average of the single crystal ((the upper limit of the growth rate+the lower limit of the growth rate)÷2).

2. The method for producing a single crystal according to claim 1, wherein the single crystal to be produced is a silicon single crystal.

3. The method for producing a single crystal according to claim 1, wherein a diameter of the straight body of the single crystal is 150 mm or more.

4. The method for producing a single crystal according to claim 1, wherein the pulling of the single crystal is performed with applying a magnetic field of a central magnetic field strength in the range of 300 gauss to 6000 gauss.

5. The method for producing a single crystal by pulling a single crystal according to claim 1, wherein the average of cooling rate in passing through the temperature region of the melt point of the single crystal to 950° C. is in the range of 0.96° C./min to 1.64° C./min and so that the average of cooling rate in passing through the temperature region of 1150° C. to 1080° C. is in the range of 0.88° C./min to 1.56° C./min and so that the average of cooling rate in passing through the temperature region of 1050° C. to 950° C. is in the range of 0.71° C./min to 1.56° C./min.

* * * * *